United States Patent
Lin et al.

(10) Patent No.: US 6,218,226 B1
(45) Date of Patent: Apr. 17, 2001

(54) METHOD OF FORMING AN ESD PROTECTION DEVICE

(75) Inventors: Geeng-Lih Lin; Ming-Dou Der, both of Hsinchu (TW)

(73) Assignee: Vanguard International Semiconductor Corporation, Hsinchu (TW)

(*) Notice: Subject to any disclaimer, the term of this patent is extended or adjusted under 35 U.S.C. 154(b) by 0 days.

(21) Appl. No.: 09/488,786

(22) Filed: Jan. 21, 2000

(51) Int. Cl.$^7$ .................................................. H01L 21/8238
(52) U.S. Cl. .......................... 438/200; 438/305; 438/306; 438/527; 438/529; 257/357
(58) Field of Search ............................... 438/200, 291, 438/305, 306, 372, 376, 377, 519, 521, 526, 527, 529; 257/355, 356, 357

(56) References Cited

U.S. PATENT DOCUMENTS

| 5,545,909 | * | 8/1996 | Williams et al. | 257/355 |
|---|---|---|---|---|
| 5,554,544 | * | 9/1996 | Hsu | 437/35 |
| 5,559,352 | * | 9/1996 | Hsue et al. | 257/328 |
| 5,585,299 | * | 12/1996 | Hsu | 437/56 |
| 5,744,841 | * | 4/1998 | Gilbert et al. | 257/360 |
| 6,040,603 | * | 3/2000 | Yang | 257/344 |

OTHER PUBLICATIONS

S. Wolf, Silicon Processing for the VLSI Era, vol. 1, Lattice Press: Sunset Beach, CA, pp. 280–283, 1986.*
Gilbert, et al. "(Performance improvement of a thick field oxide EDS protection circuit by halo implant" IEEE Proceedings on Custom Integrated Circuits Conf., pp. 35–38, May 1997.*

* cited by examiner

Primary Examiner—Charles Bowers
Assistant Examiner—Erik Kielin
(74) Attorney, Agent, or Firm—Bacon & Thomas

(57) ABSTRACT

The invention discloses a method of forming an ESD protection device without adding the extra mask layers into the traditional CMOS process. At first, P-wells, N-wells, and isolations are formed in a semiconductor substrate. Next, an NMOS transistor with a gate dielectric layer, a gate electrode, source/drain regions, lightly doped source/drain regions, and insulator spacers is formed on the substrate. Particularly, N-wells are also formed in a part of the source/drain regions of the NMOS transistor. Thereafter, ESD protection regions are formed under the source/drain regions by performing P$^+$ ESD protection implantation. Such ESD protection device has a low junction breakdown voltage, quick response speed, and a small junction capacitance.

2 Claims, 3 Drawing Sheets

METHOD OF FORMING AN ESD PROTECTION DEVICE

BACKGROUND OF THE INVENTION

1. Field of the Invention

The present invention relates to a method of forming an ESD protection device, more particularly, to a method of forming an ESD protection device with low trigger voltage and small junction capacitance, but without adding any extra mask layer into the conventional CMOS process.

2. Description of the Prior Art

The input signals to a MOS IC are fed to the gate electrodes of MOS transistors. If the voltage applied to the gate insulator becomes excessive, the gate oxide will be broken down. The dielectric breakdown strength of $SiO_2$ is approximately in the range between 1E7 to 2E7 V/cm. According to a MOS device manufactured by means of the deep-submicron technology (such as 0.18 um technology), the gate oxide has a thickness only about 40 Å and thus will not tolerate to a voltage greater than 8V without being broken down. Although the thinner gate oxide is well in excess of the normal operating voltages of 2.5-V or 3.3-V integrated circuits, a much larger voltage (as high as 2000 V) may be impressed upon the inputs to the circuits during either human-operators or mechanical handling operations. When such a high voltage is applied to the pins of an IC package, its discharge (referred to as electrostatic discharge; ESD) can cause serious damage on the gate oxide of the devices. The ESD event may cause sufficient damage to produce immediate destruction of the device, or it may weaken the oxide strength. Therefore, all pins of MOS ICs must be provided with on-chip ESD protection circuits to prevent such voltages from damaging the MOS gates.

Accordingly, before an ESD applies to the interior devices and damages their gate dielectric, the ESD protection devices have to work and bypass the ESD current. Generally, the breakdown voltage of the PN junction is a key parameter to determine the performance of an ESD protection device. The gate dielectric of integrated circuits is getting thinner in the deep-submicron era, so the breakdown voltage of IC's interior devices is getting lower. Accordingly, it is necessary to reduce the PN-junction's breakdown voltage of the ESD protection devices in order to protect the interior devices before their gate dielectrics are damaged. Therefore, it is a fairly important issue for IC industries to reduce the PN-junction's breakdown voltage of the ESD protection devices.

There are two kinds of PN-junction breakdown, i.e. Zener Breakdown and Avalanche Breakdown. Generally, the Zener Breakdown is used for breakdown mechanism of the ESD protection devices. Zener Breakdown occurs when a reversed bias is strong enough so that the electrons in the valence band of the p-type semiconductor approaching the forbidden gap can tunnel through the forbidden region and appear at the same energy in the conduction band of the n-type semiconductor. Since the probability of transmission of an electron through the barrier is a function of the thickness of the barrier, tunneling is only significant in highly doped material in which the fields are high and the depletion region is narrow. According to some prior arts, an extra step of ESD protection ion-implantation is performed to raise the doping concentration. For example, United Microelectronics Corp. in U.S. Pat. No. 5,585,299 disclosed a method of forming an ESD protection devices, in which an extra step of ESD protection ion-implantation with high energy and high dose is performed to raise the doping concentration and deepen the PN junction. The implantation is performed under the situation that there is no dielectric spacer on the sidewall of the MOS transistor, so that the doping profile of the ion implantation envelopes the LDD (Lightly Doped Drain). However, this process not only needs an extra photo mask for photolithography process, but also increases the junction capacitance so that the transmission speed for input signals becomes much slower.

In order to promote the response speed of the ESD protection devices, United Microelectronics Corp. in U.S. Pat. No. 5,559,352 disclosed a method of forming an ESD protection devices, in which an extra step of $P^+$ ESD protection implantation with high energy and high dose is performed under the source/drain contacts to lower the breakdown voltage. However, this method needs an extra mask layer to identify the region for ESD implantation.

SUMMARY OF THE INVENTION

Therefore, an object of this invention is to provide a method of forming an ESD protection device.

It is another object of this invention is to provide a method of forming an ESD protection device with low breakdown voltage and low junction capacitance.

The present invention relates to the method of forming an ESD protection device. According to the present invention, an NMOS transistor is formed, and a $P^+$ ESD protection implantation is applied to reduce the breakdown voltage of PN junction; furthermore, extra N-wells are formed in the source/drain regions of the NMOS transistor to further reduce the junction capacitance. Firstly, a P-well, N-wells, and isolations are formed in a semiconductor substrate. The N-wells are the key features of the present invention in that the design and layout of the photo mask are amended so that N-wells are also formed in a part of the source/drain regions of the NMOS transistor. As a result, the demand of reducing junction capacitance is achieved without adding any photo mask.

Next, a MOS transistor is formed by means of conventional technology. The MOS transistor comprises a gate dielectric layer, a gate electrode, source/drain regions, lightly doped source/drain regions, insulator spacers, and a nitride capping layer.

A key feature of this present invention is that the ESD protection regions are formed under the source/drain regions by means of a $P^+$ ESD protection implantation to form a heavily-doped PN junction with relatively low breakdown voltage and quick response speed, so as to achieve the purpose of protecting the interior devices. Furthermore, due to adding the N-wells in the NMOS transistor according to the present invention, the area of high-doped PN junction is largely decreased so as to reduce the total junction capacitance on the drain of the NMOS devices.

BRIEF DESCRIPTION OF THE DRAWINGS

A more complete understanding of the invention can be obtained by considering the following detailed description in conjunction with the accompanying drawings, in which.

DETAILED DESCRIPTION OF THE PREFERRED EMBODIMENTS

The present invention relates to the method of forming an ESD protection device. According to the present invention, an NMOS transistor is formed and a $P^+$ ESD protection implantation is applied to reduce the breakdown voltage of PN junction; furthermore, extra N-wells are formed in the source/drain regions of the NMOS transistor to further reduce the junction capacitance. The present invention is available for DRAM, SRAM, and any logic IC. In order for abbreviation, the following three embodiments disclose the method of forming an NMOS transistor in an ESD protection circuit. The present invention is surely available for forming a PMOS transistor in the ESD protection circuit by the method of swapping "P" and "N" in the following embodiments.

First Embodiment

Figure 1:
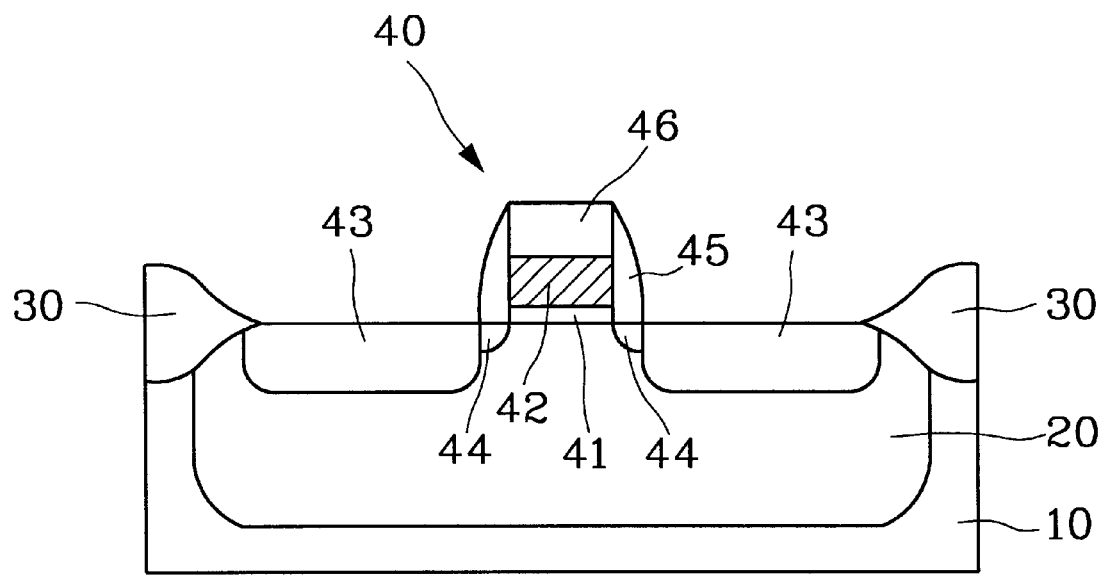
FIG. 1 is a cross-sectional diagram of forming a MOS transistor according to the first embodiment of the present invention.

Referring firstly to FIG. 1, a P-well 20 is formed in a semiconductor substrate 10 by using conventional photolithography and ion-implantation procedures. Next, isolations 30 are formed to separate each active region. The isolations 30 could be conventional LOCOS (Localized Oxidation Isolation) or STI (Shallow Trench Isolation).

Referring again to FIG. 1, a MOS transistor 40 is formed by means of conventional technology. The MOS transistor 40 comprises a gate dielectric layer 41, a gate electrode 42, source/drain regions 43, lightly doped source/drain regions 44, insulator spacers 45, and a nitride capping layer 46.

The gate dielectric layer 41 is thermally grown in an oxygen-stream ambient at a thickness between 30 to 80 Angstroms. Generally, an ion implantation procedure for threshold voltage adjustment is performed before or after the gate dielectric layer 41 is grown. The gate electrode 42 is formed from a doped polysilicon layer deposited via LPCVD (Low Pressure Chemical Vapor Deposition) to a thickness between 800 to 4000 Angstroms. The polysilicon layer can be doped in situ during deposition via the addition of arsine or phosphine to a silane ambient, or the polysilicon layer can be deposited intrinsically and then doped via an ion implantation procedure by means of arsenic or phosphorous ions. Next, a silicon nitride layer is then deposited via LPCVD or PECVD (Plasma Enhanced Chemical Vapor Deposition) procedures at a thickness between 500 to 3000 Angstroms. After that, conventional photolithographic and anisotropic Reactive Ion Etching (RIE) procedures using $CF_4$ as an etchant for silicon nitride layer and using $Cl_2$ as an etchant for polysilicon layer are used to form a gate structure with a nitride capping layer 46. Next, the photoresist shape used to define the gate structure is removed using plasma oxygen ashing and careful wet cleans. If it is desired to decrease the resistance of gate electrode, a polycide layer comprised of tungsten silicide on polysilicon can be used to replace the polysilicon layer. Lightly doped source/drain regions 44 are next formed in areas of semiconductor substrate 10 not covered by the gate structure. The Lightly doped source/drain regions 44 are formed via ion implantation of arsenic or phosphorous ions at an energy between 20 to 80 KeV and at a dose between 1E12 to 3E13 atoms/cm$^2$. Insulator spacers 45, comprised of silicon nitride, are next formed on the sides of the gate structure, via deposition of a silicon nitride layer, via PECVD or LPCVD procedures, at a thickness between about 100 to 1000 Angstroms, followed by an anisotropic RIE procedure, using $CF_4$ as an etchant. The gate structures are now encapsulated with silicon nitride, via capping silicon nitride layer and silicon nitride spacers, in order for performing a self-aligned contact process. After that, the source/drain regions 43 are formed via ion implantation of arsenic or phosphorous ions 50 at an energy between 30 to 100 KeV and at a dose between 1E14 to 5E16 atoms/cm$^2$. Accordingly, the whole MOS transistor is totally completed.

Figure 2:
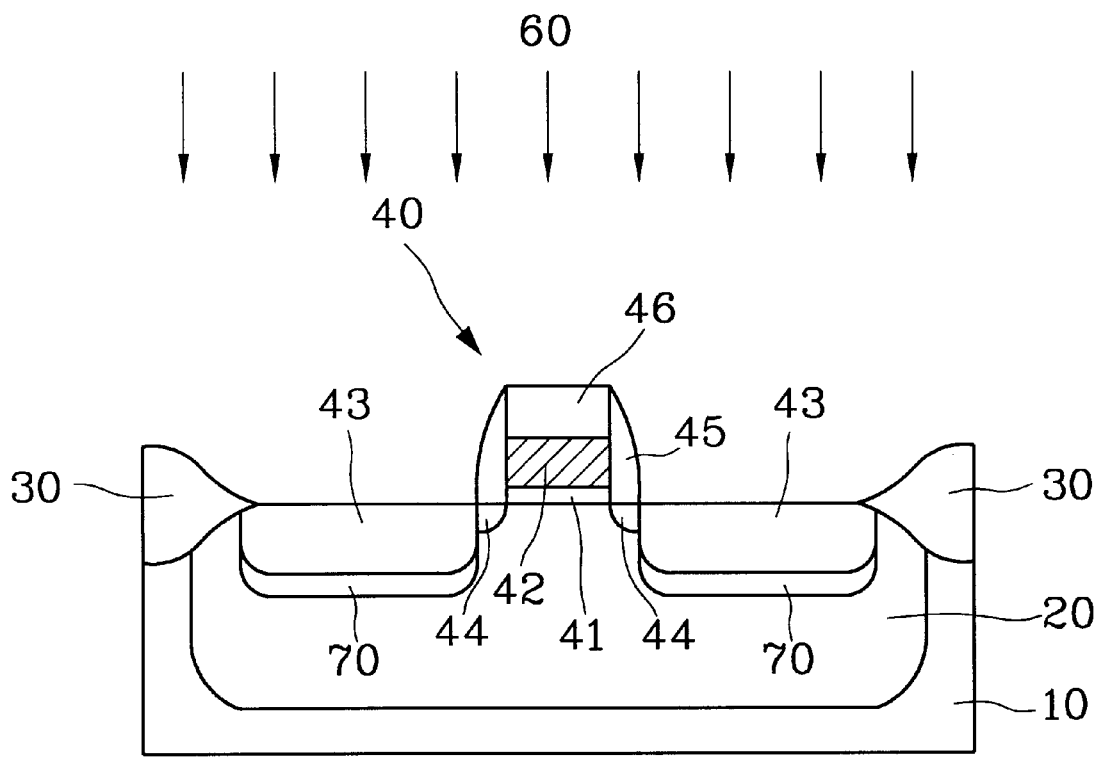
FIG. 2 is a cross-sectional diagram of forming ESD protection regions according to the first embodiment of the present invention.

Referring now to FIG. 2, the key feature of this present invention is shown. ESD protection regions 70 are formed under the source/drain regions 43 by means of a $P^+$ ESD protection implantation 60. The ESD protection implantation 60 makes use of $B^+$ or $BF_2^+$ ions as dopants at an energy between 50 to 120 KeV and at a dose between 1E14 to 5E16 atoms/cm$^2$. The implanting energy of ESD protection implantation 60 has to be larger than that of source/drain implantation 50, so that the $P^+$ ESD protection regions 70 are located under the $N^+$ source/drain regions 43 and a heavily-doped PN junction is thus formed. According to the background knowledge mentioned above, the heavily-doped PN junction has relatively low breakdown voltage and quick response speed, so as to achieve the purpose of protecting the interior devices. In comparison with the prior art which is lack of insulator spacers, the MOS transistor 40 in the present invention has insulator spacers 45 on its sidewall, so that the profile of N-channels is not affected by the ESD protection regions 70. As a result, the issue that the design and layout of devices have to accommodate the ESD protection regions in the prior art can be neglected.

In addition, the processing order of the source/drain implantation 50 and the ESD protection implantation 60 can be changed according to the present invention and also achieve the same performance.

In addition to using NMOS transistors as ESD protection devices, PMOS transistors are also available in the present invention. The process of forming the PMOS transistors is almost the same with the process of the NMOS set forth above, but by swapping P to N and N to P. In the process of performing the ESD protection implantation, N-type semiconductor materials such as arsenic or phosphorous ions are implanted at an energy between 50 to 120 KeV and at a dose between 1E14 to 5E16 atoms/cm$^2$.

Second Embodiment

An additional $N^+$ implantation is applied to the source/drain regions in this embodiment in order to increase the depth of the PN junction. The devices obtained by this embodiment can not only reduce the breakdown voltage and increase response speed of PN junction as by the first embodiment, but also further enhance the ESD-current capability. In the following description for this embodiment, the processes and schematic diagrams for forming the P-well and MOS structure on the silicon substrate are totally the same with those in the first embodiment and thus not repeated. In addition, similar parts will be marked by similar numerals according to FIG. 1 to facilitate reading of the description.

Figure 3:
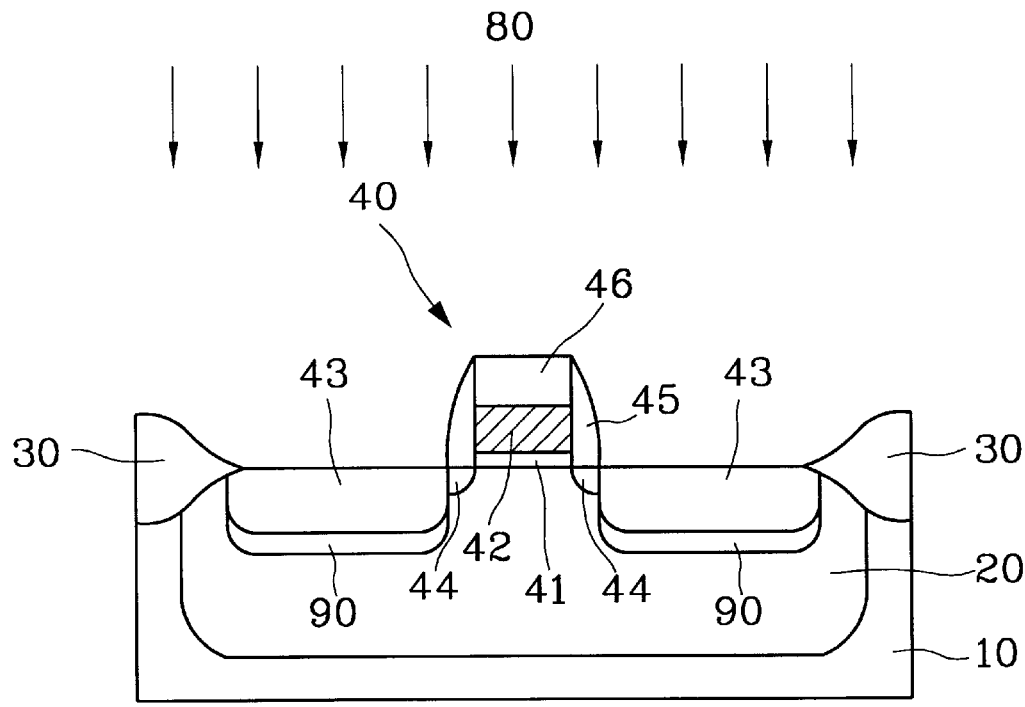
FIG. 3 is a cross-sectional diagram of forming deeply-doped regions according to the second embodiment of the present invention.

Referring now to FIG. 3, an addition $N^+$ junction-deepening implantation 80 is applied to form deeply-doped regions 90 under the source/drain regions 43. The deeply-doped regions 90 are formed via ion implantation of arsenic or phosphorous ions at an energy between 50 to 120 KeV and at a dose between 1E14 to 5E16 atoms/cm$^2$. The key feature of this process is that the doping energy of the additional N$^+$ junction-deepening implantation 80 has to be higher than that of the source/drain implantation 50 so as to increase the junction depth.

Figure 4:
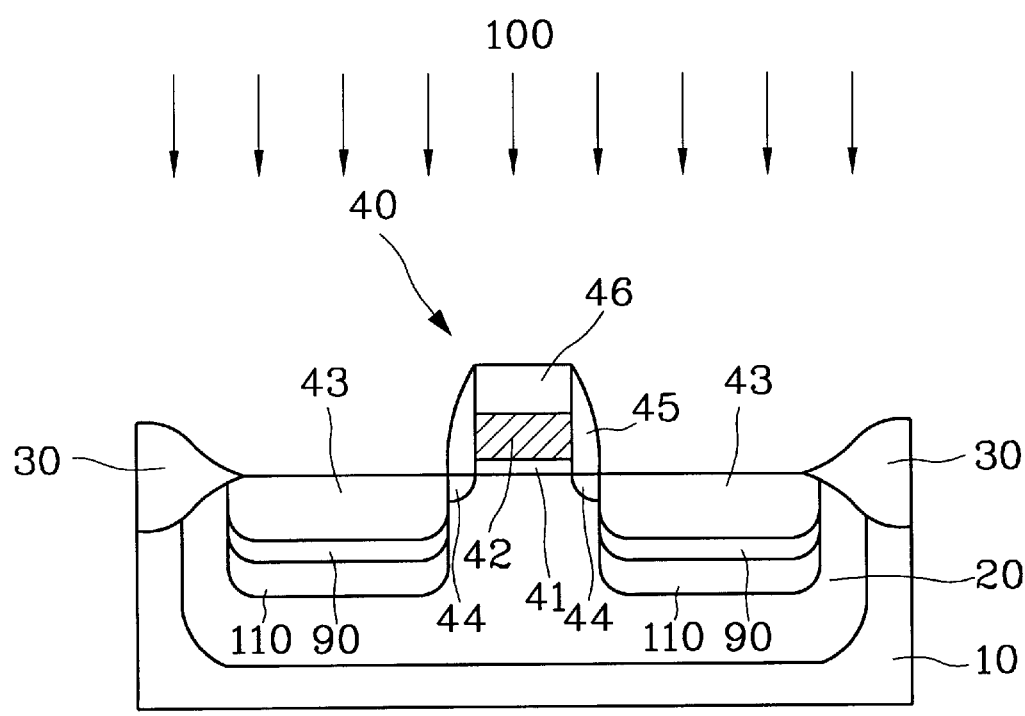
FIG. 4 is a cross-sectional diagram of forming ESD protection regions according to the second embodiment of the present invention.

Referring now to FIG. 4, ESD protection regions 110 are formed under the deeply-doped regions 90 by means of a P$^+$ ESD protection implantation 100. The ESD protection implantation 100 makes use of B$^+$ or BF2$^+$ ions as dopants at an energy between 70 to 140 KeV and at a dose between 1E14 to 5E16 atoms/cm$^2$. The implanting energy of ESD protection implantation 100 has to be larger than that of the addition N$^+$ junction-deepening implantation 80, so that the P$^+$ ESD protection regions 110 are located under the deeply-doped regions 90 to form a heavily-doped PN junction with relatively low breakdown voltage and quick response speed, so as to achieve the purpose of protecting the interior devices. Furthermore, the ESD-current capability of the ESD protection devices according to this embodiment is highly enhanced due to the deepened PN junction.

In addition, the processing order of source/drain implantation 50, junction-deepening implantation 80 and ESD protection implantation 100 can be changed one another according to the present embodiment and also achieve the same performance.

In addition to using NMOS transistors as ESD protection devices, PMOS transistors are also available in the present invention. The process of forming the PMOS transistors is almost the same with the process of the NMOS set forth above, but by swapping P to N and N to P. In this case, P-type semiconductor materials such as B$^+$ or BF2$^+$ ions are used for the junction-deepening implantation at an energy between 50 to 120 KeV and at a dose between 1E14 to 5E16 atoms/cm$^2$. In addition, N-type semiconductor materials such as arsenic or phosphorous ions are used for the ESD protection implantation at an energy between 70 to 140 KeV and at a dose between 1E14 to 5E16 atoms/cm$^2$.

Third Embodiment

An additional N$^+$ implantation is applied to the source/drain regions in this embodiment in order to reduce the capacitance of PN junction. The devices obtained by this embodiment can not only reduce the breakdown voltage and increase response speed of PN junction as by the first embodiment, but also resolve the capacitance-increasing issue due to the ESD protection implantation.

Figure 5:
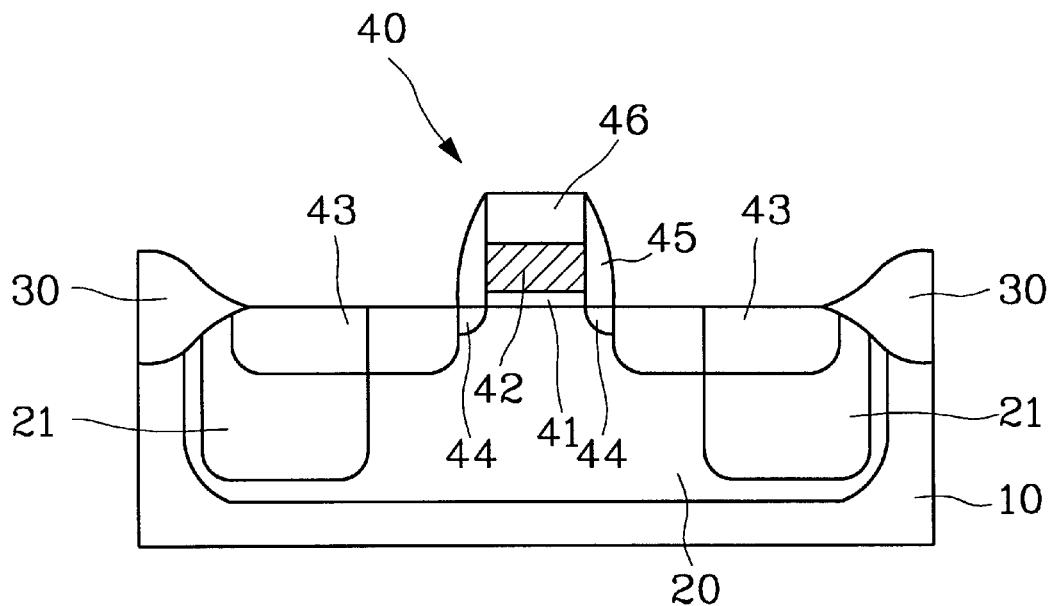
FIG. 5 is a cross-sectional diagram of forming a MOS transistor and N-wells according to the third embodiment of the present invention.

Referring firstly to FIG. 5, a P-well 20 and N-wells 21 are formed in a semiconductor substrate 10 by using conventional photolithography and ion-implantation procedures. Next, isolations 30 are formed to separate each active region. The isolations 30 could be conventional LOCOS (Localized Oxidation Isolation) or STI (Shallow Trench Isolation).

The N-wells 21 are the key features of the present invention. In the conventional IC technology, the N-well is used for forming PMOS and the P-well is used for NMOS. Nevertheless, the design and layout of the photo mask according to this embodiment are amended so that N-wells 21 are also formed in a part of the source/drain regions of NMOS ESD protection devices to reduce the heavily-doped junction area. As a result, the demand of reducing junction capacitance is achieved without adding any photo mask. The N-wells 21 are formed via ion implantation of arsenic or phosphorous ions at an energy between 70 to 140 KeV and at a dose between 1E12 to 5E13 atoms/cm$^2$.

Referring again to FIG. 5, a MOS transistor 40 is formed by means of conventional technology. The MOS transistor 40 comprises a gate dielectric layer 41, a gate electrode 42, source/drain regions 43, lightly doped source/drain regions 44, insulator spacers 45, and a nitride capping layer 46.

The gate dielectric layer 41 is thermally grown in an oxygen-stream ambient at a thickness between 30 to 80 Angstroms. Generally, an ion implantation procedure for threshold voltage adjustment is performed before or after the gate dielectric layer 41 is grown. The gate electrode 42 is formed from a doped polysilicon layer deposited via LPCVD (Low Pressure Chemical Vapor Deposition) to a thickness between 800 to 4000 Angstroms. The polysilicon layer can be doped in situ during deposition via the addition of arsine or phosphine to a silane ambient, or the polysilicon layer can be deposited intrinsically and then doped via an ion implantation procedure by means of arsenic or phosphorous ions. Next, a silicon nitride layer is then deposited via LPCVD or PECYD (Plasma Enhanced Chemical Vapor Deposition) procedures at a thickness between 500 to 3000 Angstroms. After that, conventional photolithographic and anisotropic Reactive Ion Etching (RIE) procedures using CF$_4$ as an etchant for silicon nitride layer and using Cl$_2$ as an etchant for polysilicon layer are used to form a gate structure with a nitride capping layer 46. Next, the photoresist shape used to define the gate structure is removed using plasma oxygen ashing and careful wet cleans. If it is desired to decrease the resistance of gate electrode, a polycide layer comprised of tungsten silicide on polysilicon can be used to replace the polysilicon layer. Lightly doped source/drain regions 44 are next formed in areas of semiconductor substrate 10 not covered by the gate structure. The Lightly doped source/drain regions 44 are formed via ion implantation of arsenic or phosphorous ions at an energy between 20 to 80 KeV and at a dose between 1E12 to 3E13 atoms/ci$^2$. Insulator spacers 45, comprised of silicon nitride, are next formed on the sides of the gate structure, via deposition of a silicon nitride layer, via PECVD or LPCVD procedures, at a thickness between about 100 to 1000 Angstroms, followed by an anisotropic RIE procedure, using CF$_4$ as an etchant. The gate structures are now encapsulated with silicon nitride, via capping silicon nitride layer and silicon nitride spacers, in order for performing a self-aligned contact process. After that, the source/drain regions 43 are formed via ion implantation of arsenic or phosphorous ions 50 at an energy between 30 to 100 KeV and at a dose between 1E14 to 5E16 atoms/cm$^2$. Accordingly, the whole MOS transistor is totally completed.

Figure 6:
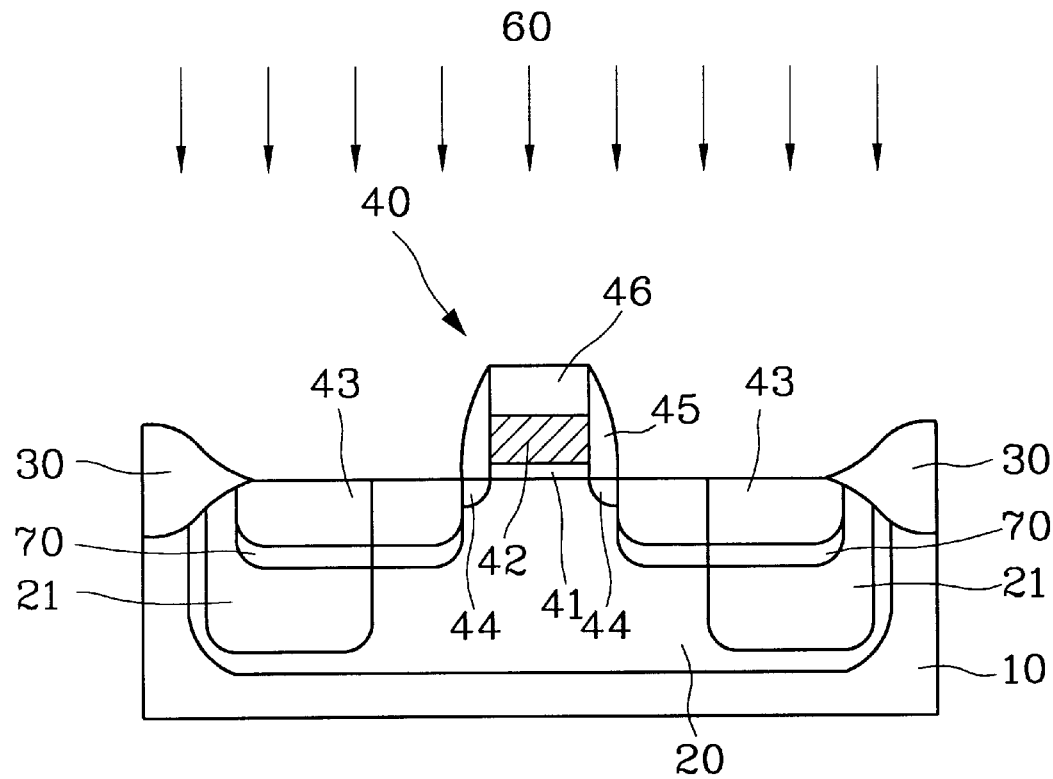
FIG. 6 is a cross-sectional diagram of forming ESD protection regions according to the third embodiment of the present invention.

Referring now to FIG. 6, the key feature of this present invention is shown. ESD protection regions 70 are formed under the source/drain regions 43 by means of a P$^+$ ESD protection implantation 60. The ESD protection implantation 60 makes use of B$^+$ or BF$_2$$^+$ ions as dopants at an energy between 50 to 120 KeV and at a dose between 1E14 to 5E16 atoms/cm$^2$. The implanting energy of ESD protection implantation 60 has to be larger than that of source/drain implantation 50, so that the P$^+$ ESD protection regions 70 are located under the N$^+$ source/drain regions 43 and a heavily-doped PN junction is thus formed. According to the background knowledge mentioned above, the heavily-doped PN junction has relatively low breakdown voltage and quick response speed, so as to achieve the purpose of protecting the interior devices. Furthermore, due to adding the N-wells in the NMOS transistor according to the present invention, the area of heavily-doped PN junction is largely decreased so as to reduce the junction capacitance. In comparison with the prior art which is lack of insulator spacers, the MOS transistor 40 in the present invention has insulator spacers 45 on its sidewall, so that the profile of N-channels is not affected by the ESD protection regions 70. As a result, the issue that the design and layout of devices have to accommodate the ESD protection implantation regions in the prior art can be neglected.

In addition, the processing order of sourceldrain implantation 50 and ESD protection implantation 60 can be changed according to the present invention and also achieve the same performance.

In addition to using NMOS transistors as ESD protection devices, PMOS transistors are also available in the present invention. The process of forming the PMOS transistors is almost the same with the process of the NMOS set forth above, but by swapping P to N and N to P. In this case, the design and layout of the photo mask according to this embodiment need to be amended so that P-wells are also formed in a part of the source/drain regions of PMOS ESD protection devices. The implantation for forming the P-wells makes use of $B^+$ or $BF_2^+$ ions as dopants at an energy between 70 to 140 KeV and at a dose between 1E12 to 5E13 atoms/cm$^2$. Furthermore, N-type semiconductor materials such as arsenic or phosphorous ions are used for the ESD protection implantation at an energy between 50 to 120 KeV and at a dose between 1E14 to 5E16 atoms/cm$^2$.

It is to be understood that although the present invention has been described with reference to particular preferred embodiments, it should be appreciated that numerous modifications, variations and adaptations may be made without departing from the scope of the invention as defined in the claims.

What is claimed is:

1. A method of forming an ESD protection device, comprising the steps of: forming P-wells, N-wells, and isolations in a semiconductor substrate; forming an NMOS transistor with a gate dielectric layer, a gate electrode, source/drain regions, lightly doped source/drain regions, and insulator spacers; the improvement which comprises: forming N-wells in a part of said source/drain regions of said NMOS transistor and performing P$^+$ ESD protection implantation to form ESD protection regions under said source/drain regions.

2. A method of forming an ESD protection device, comprising the steps of: forming P-wells, N-wells, and isolations in a semiconductor substrate; forming a PMOS transistor with a gate dielectric layer, a gate electrode, source/drain regions, lightly doped source/drain regions, and insulator spacers; the improvement which comprises: forming P-wells in a part of said source/drain regions of said PMOS transistor and performing N$^+$ ESD protection implantation to form ESD protection regions under said source/drain regions.

* * * * *